(12) United States Patent
Ye

(10) Patent No.: US 10,637,006 B2
(45) Date of Patent: Apr. 28, 2020

(54) METHOD FOR MANUFACTURING FLEXIBLE TOUCH CONTROL DISPLAY SCREEN

(71) Applicant: WUHAN CHINA STAR OPTOELECTRONICS SEMICONDUCTOR DISPLAY TECHNOLOGY CO., LTD., Wuhan, Hubei (CN)

(72) Inventor: Jian Ye, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 193 days.

(21) Appl. No.: 15/743,479

(22) PCT Filed: Dec. 28, 2017

(86) PCT No.: PCT/CN2017/119408
§ 371 (c)(1),
(2) Date: Jan. 10, 2018

(87) PCT Pub. No.: WO2019/100523
PCT Pub. Date: May 31, 2019

(65) Prior Publication Data
US 2019/0165327 A1 May 30, 2019

(30) Foreign Application Priority Data

Nov. 24, 2017 (CN) .......................... 2017 1 1189684

(51) Int. Cl.
*G06F 3/044* (2006.01)
*H01L 51/56* (2006.01)
(Continued)

(52) U.S. Cl.
CPC .............. *H01L 51/56* (2013.01); *G06F 3/044* (2013.01); *G06F 3/0412* (2013.01);
(Continued)

(58) Field of Classification Search
CPC ........... G06F 3/044; G06F 2203/04111; G06F 2203/04112; H01L 2251/5338; H01L 27/323; H01L 51/0097
See application file for complete search history.

(56) References Cited

U.S. PATENT DOCUMENTS 9,690,433 B2 * 6/2017 Hu ........................ G06F 3/044
2011/0193801 A1 * 8/2011 Jung .................... G06F 3/0412
345/173

(Continued)

*Primary Examiner* — Bradley Smith
*Assistant Examiner* — David J Goodwin
(74) *Attorney, Agent, or Firm* — Muncy, Geissler, Olds & Lowe, P.C.

(57) ABSTRACT

The present disclosure provides a method for manufacturing a flexible touch control display screen. A TFT layer, an OLED display layer, and a film encapsulation layer are sequentially formed on the substrate. A first insulation layer, a first metal bridge, a second insulation layer, a second metal layer, and a protective layer are sequentially formed on the film encapsulation layer. By patterning the first photoresist layer with the use of a multi-transmittance mask, a first contact hole and a second contact hole having different depths are formed in the insulation layer.

18 Claims, 4 Drawing Sheets

(51) Int. Cl.
  *G06F 3/041* (2006.01)
  *H01L 27/32* (2006.01)
  *H01L 51/52* (2006.01)
  *H01L 51/00* (2006.01)

(52) U.S. Cl.
  CPC .......... *G06F 3/0444* (2019.05); *G06F 3/0446* (2019.05); *H01L 27/323* (2013.01); *H01L 27/3244* (2013.01); *H01L 51/5253* (2013.01); *G06F 2203/04102* (2013.01); *G06F 2203/04103* (2013.01); *G06F 2203/04111* (2013.01); *H01L 51/0097* (2013.01); *H01L 2227/323* (2013.01); *H01L 2251/5338* (2013.01)

(56) References Cited

U.S. PATENT DOCUMENTS

| | | | |
|---|---|---|---|
| 2013/0082231 A1* | 4/2013 | Tada | G11C 13/0007 257/4 |
| 2013/0256008 A1* | 10/2013 | Zeng | H01H 11/00 174/257 |
| 2013/0266724 A1* | 10/2013 | Cheong | G06F 3/041 427/97.2 |
| 2014/0111709 A1* | 4/2014 | Kim | G02F 1/13338 349/12 |
| 2015/0027870 A1* | 1/2015 | Yang | G06F 3/041 200/5 R |
| 2016/0246405 A1* | 8/2016 | Hu | G06F 3/044 |
| 2018/0210575 A1* | 7/2018 | Xie | G06F 3/044 |
| 2018/0287092 A1* | 10/2018 | Song | G06F 3/0412 |
| 2018/0314361 A1* | 11/2018 | Chen | G06F 3/044 |

* cited by examiner

METHOD FOR MANUFACTURING FLEXIBLE TOUCH CONTROL DISPLAY SCREEN

FIELD OF INVENTION

The present disclosure relates to the field of display panels, and more particularly to a method for manufacturing a flexible touch control display screen.

BACKGROUND

Among various types of flat panels, organic light-emitting diode (OLED) displays have outstanding properties, including being light weight, thin, self-illuminating, having a short response time, wide viewing angles, a wide color gamut, high brightness, and low power consumption. Thus, OLED displays have gradually become a mainstream, next generation display technology. In comparing OLED displays with LCDs, OLED displays save more energy, are thinner, and have wider viewing angles, which the LCDs cannot achieve. Nevertheless, users are getting increasingly unsatisfied with the resolution of displayed images, and production of OLED displays with high quality and high resolution still faces a lot of challenges.

Current touch control technology can be generally classified to include an out-cell touch control technology and an in-cell touch control technology. The in-cell touch control technology is characterized by integrating touch sensors inside the display panels. Because the in-cell touch control technology, compared to the out-cell touch control technology, enables display apparatuses to have relatively lighter weight and be thinner, manufacturers of the OLED display apparatuses are directing their attention toward in-cell touch control technology. In contrast, the out-cell touch control technology is characterized by embedding a touch control screen between a color filter substrate and a polarizer of the display screen (i.e., disposing the touch sensors on the liquid crystal display panels), and thus the out-cell touch control technology, when compared to the in-cell touch control technology, would be a better choice to more easily manufacture the display apparatuses.

With the development of flexible display screens used in OLED displays, the touch control screens are being combined with the flexible display screens to be flexible and pliable as well. However, conventional touch control screens manufactured, based on a transparent conductive film, cannot meet desired flexibility requirements. On one other hand, because the conventional touch control screens have to be first manufactured independently, and then adhered to upper surfaces of the OLED screens via an optical transparent adhesive to form a complete touch control display module, such technology requires an additional bonding step and increases the entire thickness of the module. This is not helpful in enabling flexible touch control display screens being light weight and thin.

In the method for manufacturing conventional touch control display screens used in OLED displays, the touch control sensors are generally formed on OLED encapsulation film. For example, the flexible touch control sensing metal grids are formed by executing steps such as deposition, exposure, development, etching, stripping, and rinsing during the process. For the etching step, the touch control sensing electrodes and the metal binding area are etched to reach different etched depths. In the prior art, two masks are independently used to separately perform an etching step for formation of the through-holes at two ends of the metal bridge and another etching step for formation of the through-holes in the metal binding area, so as to form the two through-holes having different depths. This conventional method, though avoiding interference between formation of the through-holes during the etching step thereof, an additional mask is required. This not only increases manufacturing cost but lowers manufacturing efficiency.

SUMMARY OF DISCLOSURE

The present disclosure provides a method for manufacturing a flexible touch control display screen, which uses a mask to form two contact holes having different depths in the insulation layer above the film encapsulation layer.

To achieve such an objective, the present disclosure provides the following technical schemes.

The present disclosure provides a method for manufacturing a flexible touch control display screen, comprising:

a step S20 of sequentially depositing a first insulation layer and a first metal layer on a film encapsulation layer, and using a first mask to carry out a first masking process for the first metal layer to form a first metal bridge on a surface of the film encapsulation layer;

a step S30 of depositing a second insulation layer on a surface of the first metal bridge, wherein the second insulation layer covers the first metal bridge and the first insulation layer;

a step S40 of using a first mask to carry out a first masking process for the second insulation layer to form a first contact hole and a second contact hole in the first insulation layer and the second insulation layer; wherein the first contact hole is disposed on the first metal bridge, the second contact hole is disposed on the film encapsulation layer and is positioned to correspond to a metal binding area on the film encapsulation layer, and a depth of the first contact hole is less than a depth of the second contact hole;

a step S50 of depositing a second metal layer on a surface of the second insulation layer, and using a second mask to carry out a second masking process for the second metal layer to form at least two first electrodes, at least one second electrode, and at least three third electrodes on the second insulation layer, wherein the first electrodes intersect with the second electrode; and a step S60 of depositing a protective layer on a surface of the second metal layer, wherein the protective layer covers the second metal layer and the first insulation layer.

In accordance with one preferred embodiment of the present disclosure, before the step S20, the method further comprises:

a step S10 of providing a flexible substrate, and sequentially forming a thin film transistor (TFT) layer, an organic light-emitting diode (OLED) display layer, and the film encapsulation layer on the flexible substrate.

In accordance with one preferred embodiment of the present disclosure, the step S40 comprises:

a step S41 of coating a first photoresist layer on the second insulation layer;

a step S42 of patterning the first photoresist layer by exposing the first photoresist layer to a light through a multi-transmittance mask, and then developing the first photoresist layer to form a first developed region and a second developed region different from the first developed region; wherein the multi-transmittance mask includes a first transmittance region, a second transmittance region, and a third transmittance region;

a step S43 of performing an etching process for the first developed region and the second developed region at the same time to form the first contact hole and the second contact hole in the first insulation layer and the second insulation layer; and a step S44 of stripping the first photoresist layer.

In accordance with one preferred embodiment of the present disclosure, a transmittance of the third transmittance region, a transmittance of the first transmittance region, and a transmittance of the second transmittance region are increased in turn; and the first transmittance region is positioned to correspond to the first contact hole, and the second transmittance region is positioned to correspond to the second contact hole.

In accordance with one preferred embodiment of the present disclosure, the step S50 comprises:

a step S51 of depositing the second metal layer on the second insulation layer;

a step S52 of coating a second photoresist layer on the second metal layer;

a step S53 of patterning the second photoresist layer by exposing the second photoresist layer to a light and developing the second photoresist layer;

a step S54 of performing an etching process for the second metal layer to form the first electrodes, the second electrode, and the third electrodes; and a step S55 of stripping the second photoresist layer.

In accordance with one preferred embodiment of the present disclosure, the first electrodes are disposed on the first contact hole, the second electrode is positioned between two adjacent first electrodes formed on the first metal bridge, and the third electrodes are disposed on the metal binding area above the film encapsulation layer.

In accordance with one preferred embodiment of the present disclosure, the first electrodes are electrically connected to the first metal bridge via the first contact hole, and the third electrodes are electrically connected to the metal binding area above the film encapsulation layer via the second contact hole.

In accordance with one preferred embodiment of the present disclosure, a pattern of a touch control electrode formed by intersecting the first electrodes with the second electrode constitutes a metal grid, and the pattern of the touch control electrode is diamond-shaped, triangle-shaped, or quadrilateral-shaped.

In accordance with one preferred embodiment of the present disclosure, the first electrode is one of a touch control driving electrode and a touch control sensing electrode, and the second electrode is the other of the touch control driving electrode and the touch control sensing electrode.

Additionally, the present disclosure provides a method for manufacturing a flexible touch control display screen, comprising:

a step S20 of sequentially depositing a first insulation layer and a first metal layer on a film encapsulation layer, and using a first mask to carry out a first masking process for the first metal layer to form a first metal bridge on a surface of the film encapsulation layer;

a step S30 of depositing a second insulation layer on a surface of the first metal bridge, wherein the second insulation layer covers the first metal bridge and the first insulation layer;

a step S40 of using a first mask to carry out a first masking process for the second insulation layer to form a first contact hole and a second contact hole in the first insulation layer and the second insulation layer;

a step S50 of depositing a second metal layer on a surface of the second insulation layer, and using a second mask to carry out a second masking process for the second metal layer to form at least two first electrodes, at least one second electrode, and a plurality of third electrodes on the second insulation layer, wherein the first electrodes intersect with the second electrode; and a step S60 of depositing a protective layer on a surface of the second metal layer, wherein the protective layer covers the second metal layer and the first insulation layer.

In accordance with one preferred embodiment of the present disclosure, before the step S20, the method further comprises:

a step S10 of providing a flexible substrate, and sequentially forming a thin film transistor (TFT) layer, an organic light-emitting diode (OLED) display layer, and the film encapsulation layer on the flexible substrate.

In accordance with one preferred embodiment of the present disclosure, the step S40 comprises:

a step S41 of coating a first photoresist layer on the second insulation layer;

a step S42 of patterning the first photoresist layer by exposing the first photoresist layer to a light through a multi-transmittance mask, and then developing the first photoresist layer to form a first developed region and a second developed region different from the first developed region; wherein the multi-transmittance mask includes a first transmittance region, a second transmittance region, and a third transmittance region;

a step S43 of performing an etching process for the first developed region and the second developed region at the same time to form the first contact hole and the second contact hole in the first insulation layer and the second insulation layer; and a step S44 of stripping the first photoresist layer.

In accordance with one preferred embodiment of the present disclosure, a transmittance of the third transmittance region, a transmittance of the first transmittance region, and a transmittance of the second transmittance region are increased in turn; and the first transmittance region is positioned to correspond to the first contact hole, and the second transmittance region is positioned to correspond to the second contact hole.

In accordance with one preferred embodiment of the present disclosure, the first electrodes are disposed on the first contact hole, the second electrode is positioned between two adjacent first electrodes formed on the first metal bridge, and the third electrodes are disposed on the metal binding area above the film encapsulation layer.

In accordance with one preferred embodiment of the present disclosure, the first electrodes are electrically connected to the first metal bridge via the first contact hole, and the third electrodes are electrically connected to the metal binding area above the film encapsulation layer via the second contact hole.

In accordance with one preferred embodiment of the present disclosure, the step S50 comprises:

a step S51 of depositing the second metal layer on the second insulation layer;

a step S52 of coating a second photoresist layer on the second metal layer;

a step S53 of patterning the second photoresist layer by exposing the second photoresist layer to a light and developing the second photoresist layer;

a step S54 of performing an etching process for the second metal layer to form the first electrodes, the second electrode, and the third electrodes; and a step S55 of stripping the second photoresist layer.

In accordance with one preferred embodiment of the present disclosure, a pattern of a touch control electrode formed by intersecting the first electrodes with the second electrode constitutes a metal grid, and the pattern of the touch control electrode is diamond-shaped, triangle-shaped, or quadrilateral-shaped.

In accordance with one preferred embodiment of the present disclosure, the first electrode is one of a touch control driving electrode and a touch control sensing electrode, and the second electrode is the other of the touch control driving electrode and the touch control sensing electrode.

Compared to conventional techniques, the present disclosure is characterized by patterning the first photoresist layer with use of a multi-transmittance mask, so that a first contact hole and a second contact hole having different depths are formed in the insulation layer. The present disclosure reduces number of masks used in the manufacturing process and simplifies the manufacturing process, lowering manufacturing cost and improving manufacturing efficiency. Furthermore, since a first insulation layer is formed to block oxygen and water from eroding the OLED display layer, the first insulation layer has the functional effect of protecting the OLED display layer.

BRIEF DESCRIPTION OF DRAWINGS

To explain in detail the technical schemes of the embodiments or existing techniques, drawings that are used to illustrate the embodiments or existing techniques are provided. The illustrated embodiments are just a part of those of the present disclosure. It is easy for any person having ordinary skill in the art to obtain other drawings without labor for inventiveness.

DETAILED DESCRIPTION

Figure 1:
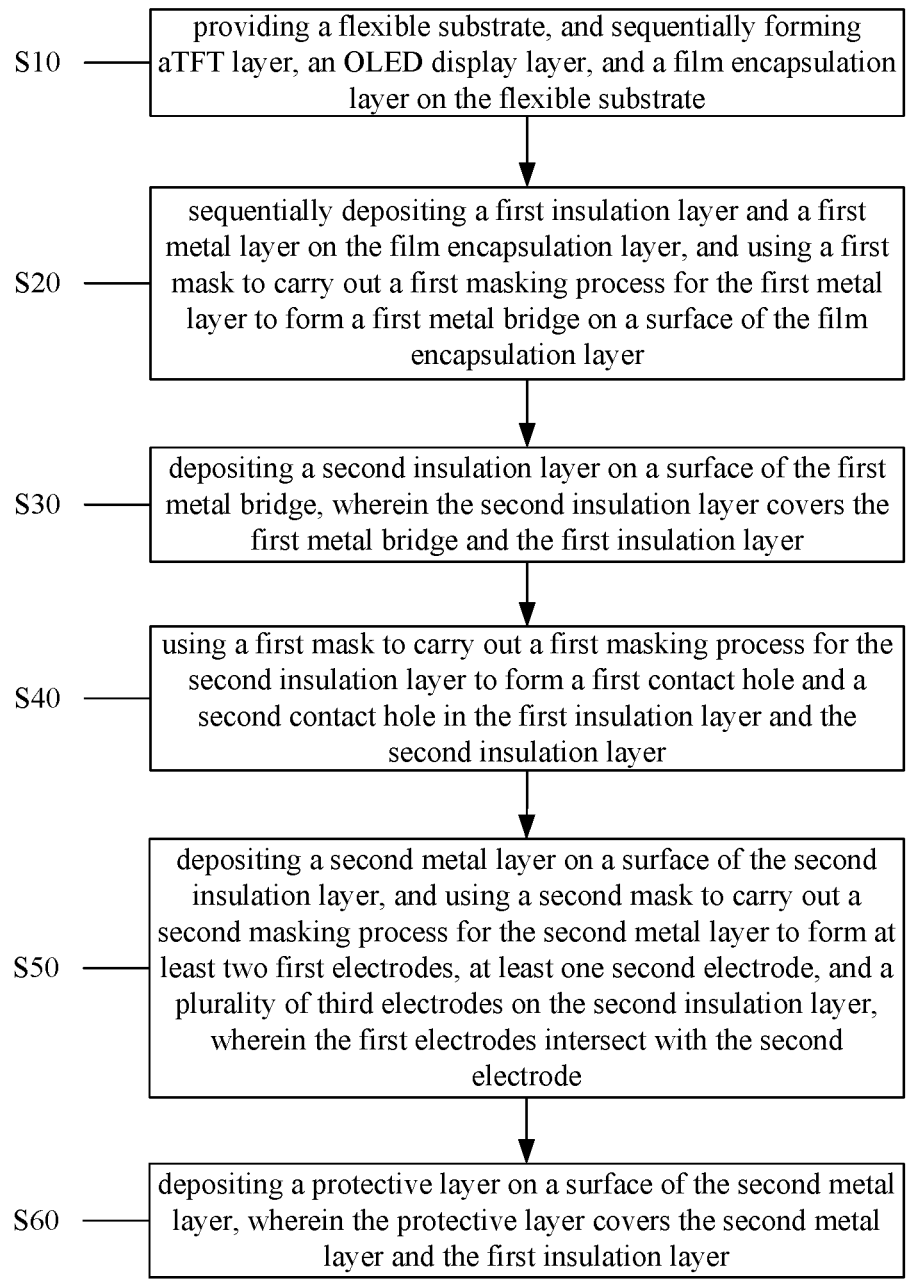
FIG. 1 is a flowchart showing a method for manufacturing a flexible touch control display screen according to one preferred embodiment of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

FIG. 1 is a flowchart showing a method for manufacturing a flexible touch control display screen according to one preferred embodiment of the present disclosure. The method includes the following steps.

In a step S10, a flexible substrate 101 is provided, and a thin film transistor (TFT) layer 102, an organic light-emitting diode (OLED) display layer 103, and a film encapsulation layer 104 are sequentially formed on the flexible substrate 101.

Figure 2:
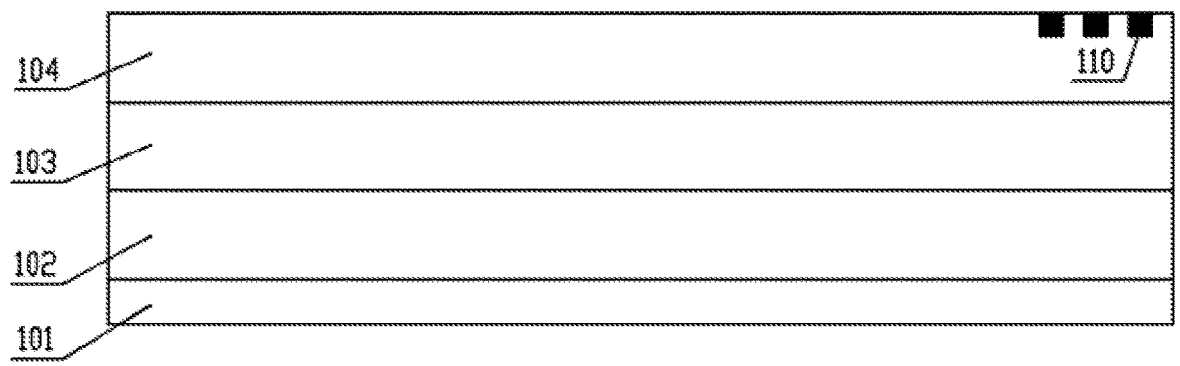
FIGS. 2, 3A, 3B, and 4-7 show a process flow of a method for manufacturing a flexible touch control display screen according to one preferred embodiment of the present disclosure.

Specifically, as shown in FIG. 2, a flexible substrate 101 is provided first. The flexible substrate 101 is a polyimide (PI) film, and is used as a base plate of the flexible display panel.

The PI film is made of PI, which is one of the best insulating materials in the world, and has high tensile strength. The PI film is formed by condensation polymerization of pyromellitic dianhydride and diaminodiphenyl ether in a strong polar solvent, being casted to form a film, and being further imidized.

Next, a TFT layer 102, an OLED display layer 103, and a film encapsulation layer 104 are sequentially formed on the flexible substrate 101. The TFT layer 102 includes a buffer layer, an active layer, a gate insulation layer, a gate layer, an inter-insulation layer, a source/drain layer, and a planarization layer.

The OLED display layer 103 includes an anode layer, a pixel defining layer, a first common layer, a light-emitting layer, a second common layer, and a cathode layer.

The film encapsulation layer 104 mainly functions to block water and oxygen in order to prevent the organic light-emitting layer from being eroded by external moisture. Typically, the film encapsulation layer 104 is composed of an organic encapsulation layer and two inorganic encapsulation layers stacked on each other. Preferably, the organic encapsulation layer is positioned in middle of the film encapsulation layer 104, and the inorganic encapsulation layers are disposed at two sides of the film encapsulation layer 104 and enclose the organic encapsulation layer.

Though the organic encapsulation layer has excellent flexibility, its ability to block water and oxygen from passing through is limited. On the other hand, though the dense pinhole-free inorganic encapsulation layer has better ability to block water and oxygen from passing through, it is difficult to form a dense film with high quality if its thickness exceeds a certain value, and thus the film property of the inorganic encapsulation layer is usually rigid and fragile. Accordingly, most of the flexible encapsulation materials used currently in this technical field have a multi-layer structure including both organic and inorganic films that are alternated with each other.

In a step 20, a first insulation layer 105 and a first metal layer are sequentially deposited on the film encapsulation layer 104, and a first mask is used to carry out a first masking process for the first metal layer to form a first metal bridge 106 on a surface of the film encapsulation layer 104.

Figure 3A:
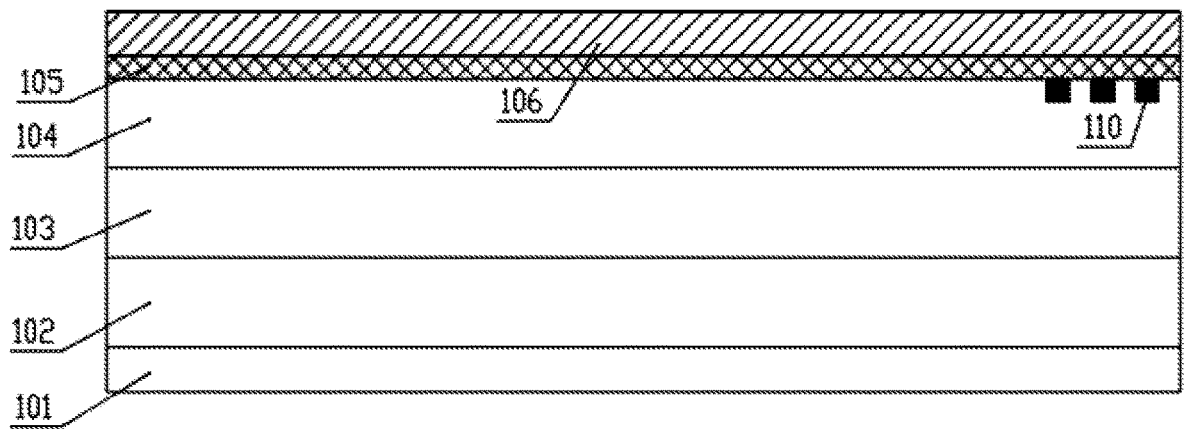

Specifically, as shown in FIG. 3A, a first insulation layer 105 is deposited on the film encapsulation layer 104 such that the first insulation layer 105 completely covers the OLED display layer 103 and the film encapsulation layer 104. In the present embodiment, the first insulation layer 105 is made of silicon nitride. Alternatively, the first insulation layer 105 is made of silicon oxide or silicon oxynitride. The first insulation layer 105 functions to protect the OLED display area by blocking oxygen and water from damaging the OLED display area.

Then, a first metal layer is deposited on the first insulation layer 105. In the present embodiment, the first metal layer can be made of titanium, aluminum, silver, or copper. Alternatively, the first metal layer can have a multi-layer structure including films made of the above described metals.

Figure 3B:
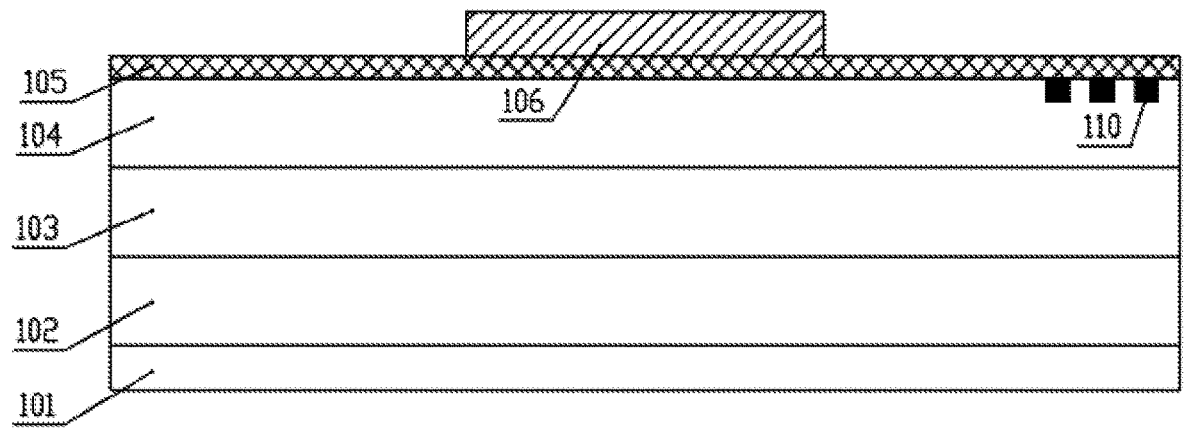

Next, a photoresist layer is coated on the first metal layer. Then, a mask is used to perform exposure to a light, development, etching, and stripping in order to pattern the photoresist layer. In this way, a first metal bridge 106 is formed on the first insulation layer 105, as shown in FIG. 3B.

In a step S30, a second insulation layer 107 is deposited on a surface of the first metal bridge 106, such that the second insulation layer 107 covers the first metal bridge 106 and the first insulation layer 105.

Figure 4:
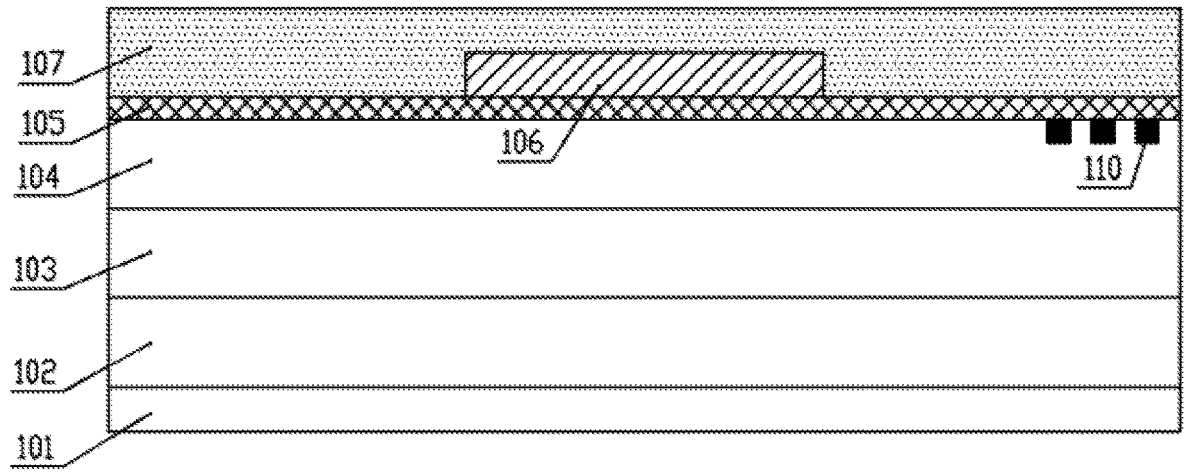

Specifically, as shown in FIG. 4, a second insulation layer 107 is deposited on a surface of the first metal bridge 106. The second insulation layer 107 is generally made of an inorganic material such as silicon oxide, silicon nitride, silicon oxynitride, aluminum oxide, or zirconium dioxide.

In case that the second insulation layer is made of silicon oxide, silicon nitride, or silicon oxynitride, the second insulation layer is formed by plasma enhanced chemical vapor deposition. In case that the second insulation layer is made of aluminum oxide or zirconium dioxide, the second insulation layer is formed by atomic layer deposition.

Atomic layer deposition is a layer-by-layer deposition method that deposits a plurality of single atomic layers on a surface of a substrate. During atomic layer deposition, formation of a new atomic layer is chemically related to a previously deposited atomic layer. Such a technique results in deposition of atomic layers one at a time in each reaction. Since each deposition cycle is self-limiting, it is easy to precisely control the thickness of the deposited thin film by controlling the number of reaction cycles.

In a step S40, a first mask is used to carry out a first masking process for the second insulation layer 107 to form a first contact hole and a second contact hole in the first insulation layer 105 and the second insulation layer 107.

Figure 5:
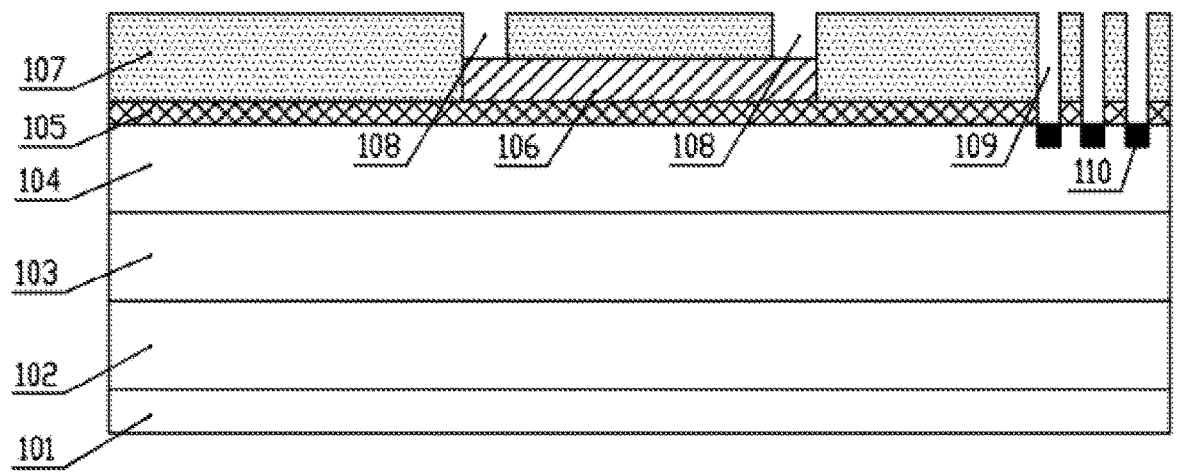

Specifically, as shown in FIG. 5, a first photoresist layer is coated on the second insulation layer 107. Then, the first photoresist layer is patterned by exposing the first photoresist layer to a light through a multi-transmittance mask, and then developing the first photoresist layer to form a first developed region and a second developed region different from the first developed region. The multi-transmittance mask includes a first transmittance region, a second transmittance region, and a third transmittance region. A light transmittance of the third transmittance region, a light transmittance of the first transmittance region, and a light transmittance of the second transmittance region are increased in turn.

Next, an etching process is performed for the first developed region and the second developed region at the same time to form a first contact hole 108 and a second contact hole 109 in the first insulation layer and the second insulation layer. The first transmittance region is positioned to correspond to the first contact hole 108, and the second transmittance region is positioned to correspond to the second contact hole 109. Finally, the first photoresist layer is stripped. A transmittance of the third transmittance region is 0%. In other words, the light during the exposure step will not pass through the third transmittance region and irradiate the first photoresist layer, and the photoresist material to which the third transmittance region is positioned to correspond will not be removed at a later development step.

The first contact hole 108 is disposed on the first metal bridge 106. The second contact hole 109 is disposed on the film encapsulation layer 104 and is positioned to correspond to a metal binding area 110 on the film encapsulation layer 104. A depth of the first contact hole is less than a depth of the second contact hole.

The first contact hole 108 passes through the second insulation 107, and is connected to the first metal bridge 106. The second contact hole 109 passes through the first insulation layer 105 and the second insulation 107, and is connected to the metal binding area 110 above the film encapsulation layer 104.

In the present embodiment, only one mask is required to form the first contact hole 108 and the second contact hole 109 that have different depths. This is accomplished by using a mask having a first transmittance region positioned to correspond to the first contact hole 108 and a second transmittance region positioned to correspond to the second contact hole 109, where the transmittance of the first transmittance region and the transmittance of the second transmittance region are different.

Therefore, in a single exposure step, the photoresist material where the first contact hole 108 is intended to be formed and the photoresist material where the second contact hole 109 is intended to be formed are subjected to different exposure doses. Take the positive type photoresist as an example (i.e., the portion of the photoresist material exposed to light will be removed after being developed). The photoresist material where the first contact hole 108 is intended to be formed is subjected to fewer exposure doses, therefore some of the photoresist material remains after being developed. In contrast, the photoresist material where the second contact hole 109 is intended to be formed is fully exposed. Consequently, in the same etching step, the remaining photoresist material where the first contact hole 108 is intended to be formed partially obstructs the etching reaction, and the first contact hole 108 is etched to have an etched depth that is less than an etched depth of the second contact hole 109, resulting in formation of the second contact hole 109 where the second contact hole 109 has different depths.

Preferably, the first contact hole 108 and the second contact hole 109 have a cross-section that is rectangle-shaped, V-shaped, or arc-shaped. In the present embodiment, the cross-section of the first contact hole 108 and the second contact hole 109 are rectangle-shaped.

In a step S50, a second metal layer is deposited on a surface of the second insulation layer 107, and a second mask is used to carry out a second masking process for the second metal layer to form at least two first electrodes, at least one second electrode, and at least three third electrodes on the second insulation layer, wherein the first electrodes intersect with the second electrode.

Figure 6:
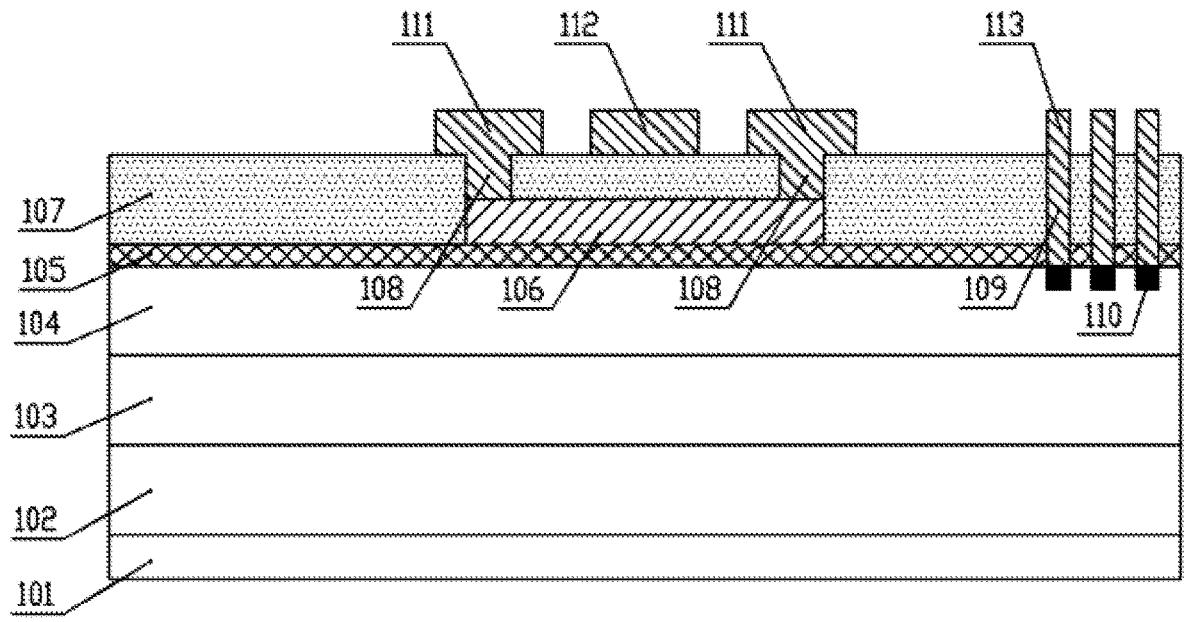

Specifically, as shown in FIG. 6, a second metal layer is deposited on a surface of the second insulation layer 107 by sputtering or vapor deposition first. The second metal layer can be made of a material that is the same as the first metal layer. Next, a second photoresist layer is coated on the second metal layer. Then, the second photoresist layer is patterned by exposing the second photoresist layer to a light and developing the second photoresist layer. Thereafter, an etching process is performed for the second metal layer to form the at least two first electrodes 111, the at least one second electrode 112, and the at least three third electrodes 113. Finally, the second photoresist layer is stripped.

The first electrodes 111 are disposed on the first contact hole 108 above the first metal bridge 106, the second electrode 112 is positioned between two adjacent first electrodes 111 formed on the first metal bridge 106, and the third electrodes 113 are disposed on the metal binding area 110 above the film encapsulation layer.

The first electrode 111 is one of a touch control driving electrode and a touch control sensing electrode, and the second electrode 112 is the other of the touch control driving electrode and the touch control sensing electrode. In the present embodiment, the first electrode 111 is a touch control driving electrode, and the second electrode 112 is a touch control sensing electrode.

The first electrodes 111 are electrically connected to the first metal bridge 106 via the first contact hole 108, so as to establish an electrical connection with the touch control driving electrode.

The third electrodes 113 are electrically connected to the metal binding area 110 above the film encapsulation layer 104 via the second contact hole 109, where the second contact hole 109 is disposed on the film encapsulation layer 104. Moreover, the third electrodes 113 are electrically connected to the flexible circuit board via an anisotropic conductive adhesive.

A pattern of a touch control electrode formed by intersecting the first electrodes 111 with the second electrode 112 constitutes a metal grid, and the metal grid is diamond-shaped, triangle-shaped, or quadrilateral-shaped.

In a step S60, a protective layer 114 is deposited on a surface of the second metal layer such that the protective layer 114 covers the second metal layer and the first insulation layer 105.

Figure 7:
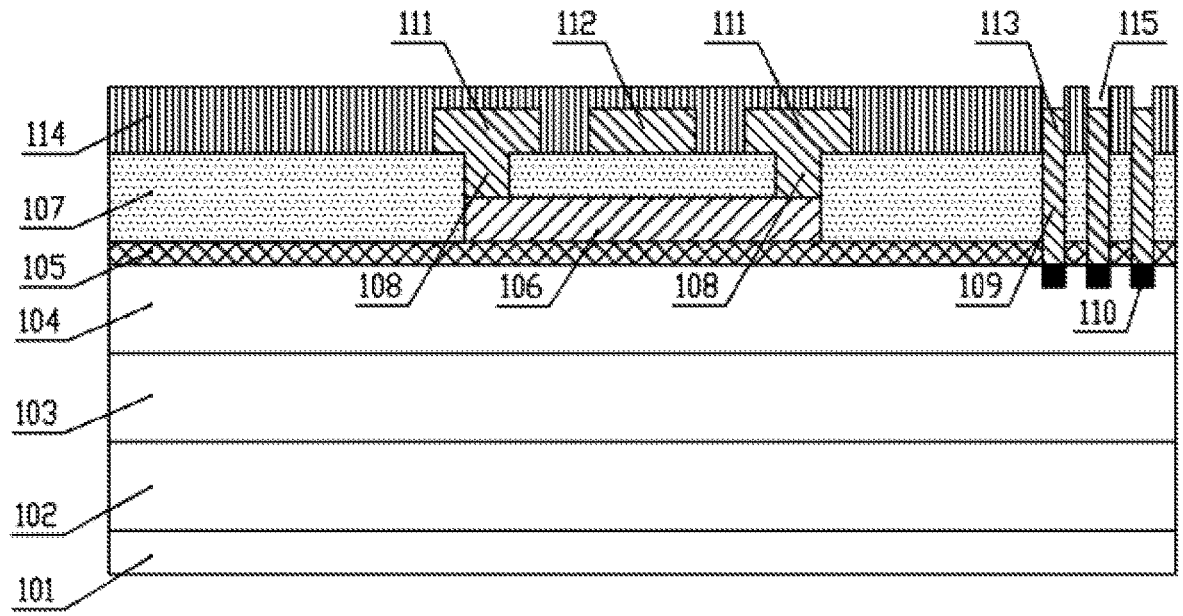

Specifically, as shown in FIG. 7, a protective layer 114 is deposited on a surface of the second metal layer. Also, an opening 115, which corresponds to the third electrode 113 disposed on the metal binding area 110 above the film encapsulation layer 104, is formed in order to enable electrical connection of the third electrodes 113 with the flexible circuit board.

The protective layer 114 is used to protect the touch control electrode. The protective layer 114 is generally formed by plasma enhanced chemical vapor deposition. Plasma enhanced chemical vapor deposition is a deposition method which provides energy to substances and excites substances to an ionized state, so as to trigger a series of chemical reactions for forming a film. Plasma enhanced chemical vapor deposition enables deposition at low temperature, and formation of films that have excellent quality without pinholes and are difficult to crack.

Typically, the protective layer 114 is made of an organic material such as $SiO_xC_yH_z$, $SiN_xC_yH_z$, or $SiO_xN_yC_zH_m$.

The present disclosure provides a method for manufacturing a flexible touch control display screen. A TFT layer, an OLED display layer, and a film encapsulation layer are sequentially formed on the substrate. A first insulation layer, a first metal bridge, a second insulation layer, a second metal layer, and a protective layer are sequentially formed on the film encapsulation layer. By patterning the aforementioned first photoresist layer with use of a multi-transmittance mask, a first contact hole and a second contact hole having different depths are formed in the insulation layer. The present disclosure reduces number of masks used in the manufacturing process and simplifies the manufacturing process, lowering manufacturing cost and improving manufacturing efficiency. Furthermore, since a first insulation layer is formed to block oxygen and water from eroding the OLED display layer, the first insulation layer has the functional effect of protecting the OLED display layer.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for manufacturing a flexible touch control display screen, comprising:
   a step S20 of sequentially depositing a first insulation layer and a first metal layer on a film encapsulation layer, and using a first mask to carry out a first masking process for the first metal layer to form a first metal bridge on a surface of the film encapsulation layer;
   a step S30 of depositing a second insulation layer on a surface of the first metal bridge, wherein the second insulation layer covers the first metal bridge and the first insulation layer;
   a step S40 of forming a first contact hole and a second contact hole in the first insulation layer and the second insulation layer; wherein the first contact hole is disposed on the first metal bridge, the second contact hole is disposed on the film encapsulation layer and is positioned to correspond to a metal binding area on the film encapsulation layer, and a depth of the first contact hole is less than a depth of the second contact hole;
   a step S50 of depositing a second metal layer on a surface of the second insulation layer, and using a second mask to carry out a second masking process for the second metal layer to fottii at least two first electrodes, at least one second electrode, and a plurality of third electrodes on the second insulation layer, wherein the first electrodes intersect with the second electrode; and
   a step S60 of depositing a protective layer on a surface of the second metal layer, wherein the protective layer covers the second metal layer and the first insulation layer.

2. The method according to claim 1, wherein, before the step S20, the method further comprises:
   a step S10 of providing a flexible substrate, and sequentially forming a thin film transistor (TFT) layer, an organic light-emitting diode (OLED) display layer, and the film encapsulation layer on the flexible substrate.

3. The method according to claim 1, wherein the step S40 comprises:
   a step S41 of coating a first photoresist layer on the second insulation layer;
   a step S42 of patterning the first photoresist layer by exposing the first photoresist layer to a light through a multi-transmittance mask, and then developing the first photoresist layer to form a first developed region and a second developed region different from the first developed region; wherein the multi-transmittance mask includes a first transmittance region, a second transmittance region, and a third transmittance region;
   a step S43 of performing an etching process for the first developed region and the second developed region at the same time to form the first contact hole and the second contact hole in the first insulation layer and the second insulation layer; and
   a step S44 of stripping the first photoresist layer.

4. The method according to claim 3, wherein a transmittance of the third transmittance region, a transmittance of the first transmittance region, and a transmittance of the second transmittance region are increased in turn; and
   wherein the first transmittance region is positioned to correspond to the first contact hole, and the second transmittance region is positioned to correspond to the second contact hole.

5. The method according to claim 1, wherein the first electrodes are disposed on the first contact hole, the second electrode is positioned between two adjacent first electrodes formed on the first metal bridge, and the third electrodes are disposed on the metal binding area above the film encapsulation layer.

6. The method according to claim 5, wherein the first electrodes are electrically connected to the first metal bridge via the first contact hole, and the third electrodes are electrically connected to the metal binding area above the film encapsulation layer via the second contact hole.

7. The method according to claim 1, wherein the step S50 comprises:
   a step S51 of depositing the second metal layer on the second insulation layer;
   a step S52 of coating a second photoresist layer on the second metal layer;
   a step S53 of patterning the second photoresist layer by exposing the second photoresist layer to a light and developing the second photoresist layer;
   a step S54 of performing an etching process for the second metal layer to form the first electrodes, the second electrode, and the third electrodes; and
   a step S55 of stripping the second photoresist layer.

8. The method according to claim 1, wherein a pattern of a touch control electrode formed by intersecting the first electrodes with the second electrode constitutes a metal grid, and the pattern of the touch control electrode is diamond-shaped, triangle-shaped, or quadrilateral-shaped.

9. The method according to claim 1, wherein the first electrode is one of a touch control driving electrode and a touch control sensing electrode, and the second electrode is the other of the touch control driving electrode and the touch control sensing electrode.

10. A method for manufacturing a flexible touch control display screen, comprising:
    a step S20 of sequentially depositing a first insulation layer and a first metal layer on a film encapsulation layer, and using a first mask to carry out a first masking process for the first metal layer to form a first metal bridge on a surface of the film encapsulation layer;
    a step S30 of depositing a second insulation layer on a surface of the first metal bridge, wherein the second insulation layer covers the first metal bridge and the first insulation layer;
    a step S40 of forming a first contact hole and a second contact hole in the first insulation layer and the second insulation layer;
    a step S50 of depositing a second metal layer on a surface of the second insulation layer, and using a second mask to carry out a second masking process for the second metal layer to form at least two first electrodes, at least one second electrode, and a plurality of third electrodes on the second insulation layer, wherein the first electrodes intersect with the second electrode; and
    a step S60 of depositing a protective layer on a surface of the second metal layer, wherein the protective layer covers the second metal layer and the first insulation layer.

11. The method according to claim 10, wherein, before the step S20, the method further comprises:
    a step S10 of providing a flexible substrate, and sequentially forming a thin film transistor (TFT) layer, an organic light-emitting diode (OLED) display layer, and the film encapsulation layer on the flexible substrate.

12. The method according to claim 10, wherein the step S40 comprises:
    a step S41 of coating a first photoresist layer on the second insulation layer;
    a step S42 of patterning the first photoresist layer by exposing the first photoresist layer to a light through a multi-transmittance mask, and then developing the first photoresist layer to form a first developed region and a second developed region different from the first developed region; wherein the multi-transmittance mask includes a first transmittance region, a second transmittance region, and a third transmittance region;
    a step S43 of performing an etching process for the first developed region and the second developed region at the same time to form the first contact hole and the second contact hole in the first insulation layer and the second insulation layer; and
    a step S44 of stripping the first photoresist layer.

13. The method according to claim 12, wherein a transmittance of the third transmittance region, a transmittance of the first transmittance region, and a transmittance of the second transmittance region are increased in turn; and
    wherein the first transmittance region is positioned to correspond to the first contact hole, and the second transmittance region is positioned to correspond to the second contact hole.

14. The method according to claim 10, wherein the first electrodes are disposed on the first contact hole, the second electrode is positioned between two adjacent first electrodes formed on the first metal bridge, and the third electrodes are disposed on the metal binding area above the film encapsulation layer.

15. The method according to claim 14, wherein the first electrodes are electrically connected to the first metal bridge via the first contact hole, and the third electrodes are electrically connected to the metal binding area above the film encapsulation layer via the second contact hole.

16. The method according to claim 10, wherein the step S50 comprises:
    a step S51 of depositing the second metal layer on the second insulation layer;
    a step S52 of coating a second photoresist layer on the second metal layer;
    a step S53 of patterning the second photoresist layer by exposing the second photoresist layer to a light and developing the second photoresist layer;
    a step S54 of performing an etching process for the second metal layer to form the first electrodes, the second electrode, and the third electrodes; and
    a step S55 of stripping the second photoresist layer.

17. The method according to claim 10, wherein a pattern of a touch control electrode formed by intersecting the first electrodes with the second electrode constitutes a metal grid, and the pattern of the touch control electrode is diamond-shaped, triangle-shaped, or quadrilateral-shaped.

18. The method according to claim 10, wherein the first electrode is one of a touch control driving electrode and a touch control sensing electrode, and the second electrode is the other of the touch control driving electrode and the touch control sensing electrode.

* * * * *